United States Patent [19]

Wysocki

[11] 4,163,667

[45] Aug. 7, 1979

[54] DEFORMABLE IMAGING MEMBER USED IN ELECTRO-OPTIC IMAGING SYSTEM

[75] Inventor: Joseph J. Wysocki, Webster, N.Y.

[73] Assignee: Xerox Corporation, Stamford, Conn.

[21] Appl. No.: 405,364

[22] Filed: Oct. 11, 1973

[51] Int. Cl.$^2$ ........................ G03G 5/04; G03G 16/00; G11C 11/44; G02B 7/06

[52] U.S. Cl. ..................................... 96/1.5 N; 96/1.1; 346/77 R; 427/89; 365/112

[58] Field of Search .................................. 96/1.5, 1.1; 340/173 TP, 173 PP, 173 LT, 173 LS; 346/77 R; 427/89

[56] References Cited

U.S. PATENT DOCUMENTS 3,716,359 2/1973 Sheridon ................................ 96/1.1

OTHER PUBLICATIONS

CRC Handbook–Chem. & Phys. 51st Ed. ('71), pp. B-17 & F-141.

*Primary Examiner*—J. Travis Brown
*Assistant Examiner*—Louis Falasco

[57] ABSTRACT

Electro-optic imaging members including photoconductive material, a deformable elastomer layer and a thin, flexible conductive metallic layer are described. The metallic layer comprises titanium and silver. Methods for forming the metallic layer and imaging methods utilizing the novel imaging members are also disclosed.

28 Claims, 6 Drawing Figures

DEFORMABLE IMAGING MEMBER USED IN ELECTRO-OPTIC IMAGING SYSTEM

BACKGROUND OF THE INVENTION

This invention relates to electro-optic imaging members and, more specifically, to multi-layered imaging members including a deformable elastomer layer and a thin flexible, conductive metallic layer. The invention also relates to methods for forming the metallic layer and imaging methods utilizing the novel imaging members.

There is known in the imaging art a broad class of imaging members which record optical images by an imagewise distribution of photogenerated voltages or currents acting upon a voltage or current-alterable recording medium. Typically, in these members, imagewise activating radiation incident on a photoconductor allows charge carriers to move in an external electric field. These charge carriers interact with a voltage or current-sensitive member which, in turn, modulates light.

U.S. Pat. No. 2,896,507 describes an imaging member which includes a photoconductive layer and an elastically deformable layer sandwiched between a pair of electrodes, one of which is a thin metallic layer overlying the deformable layer. In operation, imagewise activating radiation is directed upon the member and an electrical field is established across the photoconductive and deformable layers thus causing these layers to deform in imagewise configuration. The member is described as being capable of functioning as an image intensifier since the deformation image may then be read out with a high intensity light source and a schlieren optical system.

Devices of this type are of great interest because of the many applications in which they may be utilized such as, for example, image intensification, image storage, etc. Of course, for commercial purposes these devices typically should be capable of a great many imaging cycles, for example, at least about 100,000 and preferably many more. For satisfactory performance, many demands are imposed upon the metallic electrode layer. This thin metallic layer desirably should be highly reflective to utilize the read out light efficiently; have good lateral conductivity since, as one electrode of the device, it should allow charge exchange with all points of the device; be highly flexible in order that the imaging deformations can occur without any impediment at the operating conditions; have excellent stability, i.e., its imaging properties should not change substantially during shelf storage or under repeated cycling; and have little internal stress since, for example, any appreciable tension would typically tend to reduce the maximum deformation and also tend to shift it to lower spatial frequencies. An important requirement is that the metallic layer should be adherent to the deformable layer so as to couple efficiently the deformations of the metallic layer to those of the deformable layer.

It should be noted that U.S. Pat. No. 2,896,507 is completely silent as to materials which may be used for the metallic layer and also as to methods for forming the metallic layer on the deformable layer. It will also be appreciated that enormous problems are encountered in providing metallic layers which are capable of satisfying the demands imposed on them. For example, in such thin layers some metals may be highly reflective but may not be sufficiently conductive.

Recently, a major advance in the art was made by Sheridon who disclosed the Ruticon (derived from the Greek words "rutis" for wrinkle and "icon" for image) family of imaging members wherein the voltage-sensitive, light modulating recording medium comprises a deformable elastomer layer and the photoconductive material may be provided as a separate layer or incorporated in the elastomer layer. (For a detailed description of the Ruticon devices see *IEEE Transactions On Electron Devices,* September, 1972, and U.S. Pat. No. 3,716,359). Various different embodiments for establishing an electric field across the elastomer layer are described.

In the embodiment referred to by Sheridon as the Gamma Ruticon, a thin flexible metallic layer is provided on the surface of the elastomer layer and serves as one electrode for the device. Sheridon's Gamma Ruticon is capable of excellent performance for a great many imaging cycles, because, inter alia, the flexible metallic layer is capable of satisfying the stringent requirements placed on it. Sheridon obtains this desirable result by forming metallic layers comprising a plurality of different metals. The preferred metallic layer composition comprises gold and indium. Other metals suitable for use in the metallic layers of the Gamma Ruticon devices are also disclosed (see particularly Column 10, lines 1-8 of U.S. Pat. No. 3,716,359). It is also disclosed that other materials may be added to these layers to enhance or suppress particular characteristics. Various techniques for forming the metallic layer on the elastomer layer are described including, for example, by vacuum evaporation.

Although, as aforesaid, the metallic layer compositions disclosed by Sheridon are capable of excellent performance, it is always desirable to improve certain operating characteristics of such metallic layers. In relatively new and growing areas of technology, such as electro-optic imaging members including a deformable elastomer layer, new materials for use in these members continue to be discovered. The present application relates to a new and advantageous flexible metallic layer composition.

SUMMARY OF THE INVENTION

It is therefore an object of this invention to provide novel electro-optic imaging members.

It is another object of this invention to provide electro-optic imaging members including a deformable elastomer layer and a flexible conductive metallic layer.

It is a further object of the invention to provide a novel composition comprising titanium and silver which is suitable for use as the flexible conductive metallic layer in such electro-optic imaging members.

It is still another object to provide imaging methods utilizing the novel electro-optic members of the invention.

Another object of the invention is to provide methods for forming the novel flexible conductive metallic layer.

BRIEF SUMMARY OF THE INVENTION

These and other objects and advantages are accomplished in accordance with the present invention by forming a thin, flexible conductive metallic layer comprising titanium and silver on a surface of a deformable elastomer layer in an electro-optic imaging member which also includes photoconductive insulating material. In one embodiment, the photoconductive material is present as a discrete layer; or in another embodiment, the photoconductive material is incorporated in the deformable elastomer layer. The flexible conductive metallic layer serves as one electrode for the imaging member which, preferably, has another electrode arranged on the other side of the imaging member.

BRIEF DESCRIPTION OF THE DRAWINGS

For a better understanding of the invention as well as other objects and further features thereof, reference is made to the following detailed description of various preferred embodiments thereof, taken in conjunction with the accompanying drawings wherein.

DESCRIPTION OF THE PREFERRED EMBODIMENTS

Figure 1:
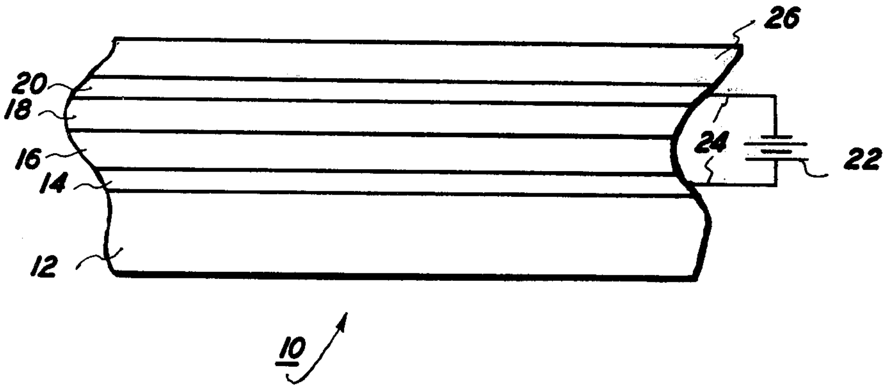
FIG. 1 is a partially schematic, cross-sectional view of an electro-optic imaging member according to the invention.

In FIG. 1 there is shown in partially schematic, cross-sectional view an electro-optic imaging member, generally designated 10, wherein a substantially transparent support substrate 12 and substantially transparent conductive layer 14 comprise a substantially transparent electrode. It should be noted here that the electrode need not be transparent; it may be opaque depending upon how imaging device 10 is used. Overlying conductive layer 14 is a layer of photoconductive insulating material 16 which, in turn, carries deformable elastomer layer 18. In another embodiment the photoconductive insulating material may be incorporated in the deformable elastomer layer 18 thus obviating the necessity for layer 16. Overlying elastomer layer 18 is a thin, flexible conductive metallic layer 20 which serves as a second electrode for the imaging device. The electrodes are connected to potential source 22 through leads 24. Potential source 22 may be A.C., D.C. or a combination thereof. The external electrical circuit may also include suitable switching means (not shown).

It should be noted that substrate 12 and conductive layer 14 are not required when the electric field is established by means of corona charging. For example, the field may be applied by the double sided corona charging technique wherein one corona charging device is arranged on each side of the imaging member or, alternatively, one side of the imaging member may be corona charged while the other side is grounded. Of course, it is possible to have a substrate in the imaging member when the field is established in this manner; in which case, it need not be laterally conductive.

In operation of the imaging device 10, an electric field is established across photoconductive layer 16 and elastomer layer 18 by applying a potential from source 22 to the electrodes. With the electric field on, an imagewise pattern of activating electromagnetic radiation is directed upon the imaging member. The electric field induces a flow of charge in the regions of the photoconductive layer 16 which are exposed to the radiation thus varying the field across the elastomer layer 18. The mechanical force of the electric field causes the elastomer layer to deform in a pattern corresponding to the imagewise activating radiation. The conductive metallic layer 20 is sufficiently flexible to follow the deformations of elastomer layer 18.

It will be appreciated that the activating electromagnetic radiation must reach the photoconductive insulating layer 16. Where flexible conductive metallic layer 20 is opaque, the support substrate 12 and conductive layer 14 must be transparent to allow the image information to reach the photoconductive layer 16. In this instance image information may be read out continuously if the readout light is incident from above the member 10. If the metallic layer 20 is transparent, readout radiation may be reflected from its surface or the device 10 may be read out in transillumination provided substrate 12 and conductive layer 14 are transparent.

As aforesaid, the bottom electrode of the imaging member 10 may comprise any suitable conductive material and may be transparent or opaque. The electrode may be a single layer of conductive material or it may comprise, as illustrated in FIG. 1, a transparent conductive layer arranged on a suitable support substrate such as, for example, glass or plastic materials. Typical suitable transparent conductive layers include continuously conductive coatings of conductors such as tin, indium oxide, aluminum, chromium, tin oxide or any other suitable conductors. These substantially transparent conductive coatings are typically evaporated onto the more insulating transparent substrate. NESA glass, a tin oxide coated glass manufactured by the Pittsburgh Plate Glass Company, is a commercially available example of a typical transparent conductive layer coated over a transparent substrate.

Any typical suitable photoconductive insulating material may be used for layer 16. Typical suitable photoconductive insulating materials include, for example, selenium, poly-n-vinylcarbazole (PVK), poly-n-vinylcarbazole doped with sensitizers such as Brilliant green dye, phthalocyanine and 2,4,7-trinitro-9-fluorenone (TNF); cadmium sulfide, cadmium selenide; zinc oxide, sulfur, anthracene and tellurium. Additionally, photoconductive layer 16 may comprise a finely ground photoconductive insulating material dispersed in a high resistance electrical binder such as is disclosed in U.S. Pat. No. 3,121,006 to Middleton et al, or an inorganic photoconductive insulating material such as is disclosed in U.S. Pat. No. 3,121,007 to Middleton et al, or an organic photoconductor such as phthalocyanine in a binder. Generally, any photoconductive insulating material or composition may be used for layer 16.

The thickness of the photoconductive layer 16 is typically in the range from about 0.1 microns to about 200 microns or more; the thickness of the layer in any particular instance depends, inter alia, largely upon the spatial frequency of the information to be recorded.

Photoconductive layer 16 may be formed on substrate 14 by any of the many methods which are well-known to those skilled in the art including, for example, vacuum evaporation, dip coating from a solution, etc. It is again noted that the photoconductive material may be included in deformable elastomer layer 18 thus obviating the need for layer 16.

Deformable layer 18 may comprise any suitable elastomer material. Typical suitable elastomeric soft solid materials for use in the imaging devices of the invention include both natural (such as natural rubber) and synthetic polymers which have rubber-like characteristics, i.e., are elastic, and include materials such as styrene-butadiene, polybutadiene, neoprene, butyl, polyisoprene, nitrile, urethane and ethylene rubbers. A preferred class of elastomer materials includes water-based gelatin gels and dimethylpolysiloxane gels. The elastomers generally should be reasonably good insulators and typically have volume resistivities above about $10^4$ ohm-cm and shear moduli of from about 10 to about $10^8$ dynes/cm$^2$ and dielectric strengths above about 10 volts/mil. Preferably, the elastomers will have volume resistivities above about $10^{13}$ ohm-cm, shear moduli of from about $10^2$ to about $10^5$ dynes/cm$^2$ and dielectric strengths greater than about 500 volts/mil. Commercially available elastomers which have been found to be suitable for use include: Sylgard 182, Sylgard 184, Sylgard 188 (available from Dow Corning Co.), RTV 602 and RTV 615 (abailable from General Electric Co.). The higher volume resistivity elastomers are preferred since they typically provide extended image storage capability. Elastomers having relatively high dielectric strength are preferred because they typically allow the devices to be operated at relatively high voltage levels which is desirable.

A particularly preferred elastomer is a transparent, very compliant composition which comprises an elastomeric dimethylpolysiloxane gel made by steps including combining about one part by weight of Dow Corning No. 182 silicone resin potting compound, about 0.1 part by weight of curing agent and anywhere from about zero to about thirty parts by weight of Dow Corning No. 200 dimethylpolysiloxane silicone oil. Other suitable resins include transparent flexible organosiloxane resins of the type described in U.S. Pat. No. 3,284,406 in which a major portion of the organic groups attached to silicon are methyl radicals.

The thickness of elastomer layer 18 is typically in the range of from about 0.1 microns to about 2000 microns depending, inter alia, upon the spatial frequency of the information to be recorded. Various optical properties of the imaging member may be enhanced by a suitable selection of the elastic modulus of the particular elastomer material used. For example, a relatively more stiff elastomer will typically recover more rapidly from an image when the electric field is removed and thus may be erased more quickly. On the other hand, an elastomer material having a relatively low elastic modulus is typically capable of greater deformations and hence greater optical modulation for a given value of electric field. The elastomer material may be coated on the photoconductor layer 16 as a monomer and polymerized in situ or it may be coated on the photoconductor surface from solutions in volatile solvents which will evaporate and leave a thin uniform layer. The elastomer layer may also be formed by spin coating techniques.

Flexible conductive layer 20 must be sufficiently flexible to follow the deformations of the elastomer layer 18. In addition, as noted previously, for satisfactory performance conductive layer 20 desirably should be highly reflective, have good lateral conductivity, have excellent stability, little internal stress and be highly adherent to the elastomer layer 18.

In the advantageous imaging members of the present invention, flexible conductive layer 20 comprises titanium and silver. Since layer 20 is typically opaque, then substrate 12 and conductive layer 14 are preferably transparent in order to allow image information to reach photoconductive layer 16. Of course, additional materials may be added to the layer to enhance or suppress particular characteristics. Materials such as gold and/or indium and the like may be incorporated in the flexible conductive layer to enhance characteristics such as spectral reflectivity or suppress characteristics such as scattering or reduce internal stresses. The thickness of flexible conductive layer 20 is typically in the range of from about 100 angstroms to about several thousand angstroms depending, inter alia, upon the desired flexibility and the requisite conductivity. In the instance where optical isolation between the readin and readout illumination is desired (the image information is read in through the substrate and the imaging member is read out by reflection), an optical density of about 6 is typically preferred for the titanium-silver layer. When smaller or larger optical density is required, the layer can be made thinner or thicker. Where isolation between the readin and readout illumination is not required, then layers having an optical density of about 2 would typically be satisfactory.

Flexible conductive layer 20 may be formed by various techniques including by chemical reaction, precipitation from a solution, electrophoresis, electrolysis, electroless plating, vapor deposition and others. It is preferred to form the advantageous titanium-silver flexible conductive layers of the present invention by vapor deposition. Of course, it is known that vapor deposited metal layers tend to shrink, i.e., contract, as they cool and at some thermo-energy state, the metal layer may tend to break up or crack making the layer discontinuous. This break up of a metal layer is commonly referred to as "mud cracking" since mud cracks are broadly descriptive of the appearance of such layers after shrinkage. This problem can be avoided in the formation of flexible conductive layer 20 by vapor depositing the second metal over the first vapor deposited metal before the first has mud cracked. Alternatively, the two metals may be vapor deposited simultaneously. Although the titanium and silver may be deposited in any order, it is preferred to deposit the titanium first. The titanium-silver flexible conductive layer formed by this technique is a highly reflective continuous layer which exhibits the requisite characteristics and yet does not experience mud cracking over a wide range of temperatures, for example, typically up to about 100° C. or more. The layer may include portions where the two metals (or other suitable materials) are coated one over the other, portions where the two metals are intermixed macroscopically as well as microscopically (e.g., to form an alloy) and portions where they reside side by side.

It has been found that highly successful flexible conductive metal layers can be formed by evaporating the metals onto the elastomer in a layered sequential manner, e.g., titanium, then silver, then titanium, then silver, etc., with the number of layers determined primarily by the desired opacity. Of course, in some instances, a given coating schedule may have to be modified to accommodate material changes, for example, increasing the compliance of the elastomer layer generally requires a thicker titanium layer to obtain metal layers with relatively low lateral resistance.

For greater accuracy and convenience, the thickness of the metal layers will be expressed below herein in terms of frequency change. Measurements are made with a 5 MHz Sloan Thickness Monitor which relates thickness of deposit to frequency change in a resonating quartz system. In principle frequency change $\Delta f$ can be converted into thickness units by the formulas: $t_{Ti}=0.445\ \Delta f$ and $t_{AG}=0.190\ \Delta f$. When $\Delta f$ is in Hz, t is in Å. These formulas assume the deposited material has a density equal to that of bulk material. This assumption is rarely correct when the substrate (in this case the elastomer) is a relatively soft material. In those cases the effective density may be 2 or 3 times smaller than bulk density so that the thickness values determined by the above formulas are too low by approximately the same factor. Thus, because of the uncertainty in the coating density, it is preferred to specify the metal layer thickness in terms of frequency change.

It has been found that both the titanium and silver deposits should be sufficiently thick to ensure adequate electrical conductivity. Typically, at least approximately 50 Hz of titanium and about 2 to 3 KHz of silver are required to form the desired layer. It is again noted that it is advantageous for enhanced reflectivity in the flexible conductive metal layer to form the layer in at least two steps with a few minutes lapse between steps. A typical titanium-silver metal layer would be formed according to the following schedule: 50 Hz Ti; 1 KHz Ag; 1.7 KHz Ag; repeating this sequence three additional times.

An adequate vacuum must be used in evaporating the metals to form the flexible conductive layer. Vacuums of about $10^{-5}$ torr and below are typically acceptable. The metals should be preferably deposited at as high a rate as practicable. Additionally, it has been found that maintaining the substrate at room temperature, or slightly above, during deposition of the metals typically provides a longer lasting, higher quality metal layer.

Figure 2:
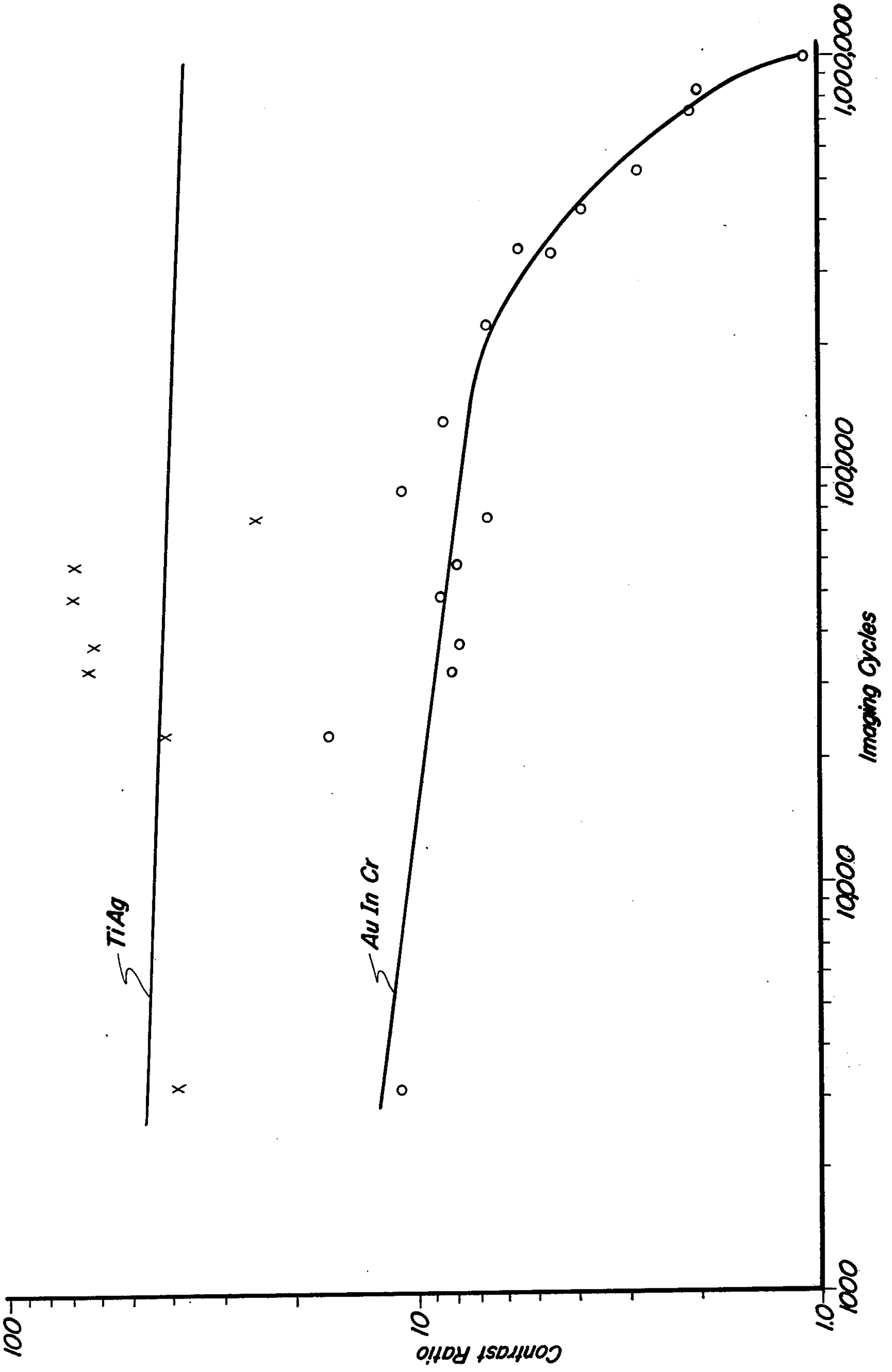
FIG. 2 is a logarithmic graphical illustration showing contrast ratio vs. number of imaging cycles for an imaging member of the present invention and a prior art imaging member.

It has been found that imaging members including the novel titanium-silver flexible metallic layers of the present invention are capable of providing excellent performance over a great number of imaging cycles. FIG. 2 is a logarithmic graphical illustration showing the contrast ratio vs. number of imaging cycles for an imaging member of the invention and a prior art imaging member. The contrast ratio of the imaging members is given by the expression:

$$\text{CONTRAST RATIO} = \frac{\text{DIFFRACTION EFFICIENCY AT A SPECIFIED VOLTAGE AND EXPOSURE}}{\text{DIFFRACTION EFFICIENCY AT ZERO VOLTAGE}}$$

The imaging members used to obtain the results illustrated in FIG. 2 were made as follows: a 40 line pair/mm chromium screen was deposited on the conductive surface of a NESA glass electrode having an active area of about 2"×2". A photoconductive composition was made by dissolving about 78 gms of poly-n-vinylcarbazole in about 1200 cc of tetrahydrofuran and, subsequently, adding about 52 gms of 2,4,7-trinitro-9-fluorenone and stirring overnight. The solution had a viscosity of about 100 centipoises. An approximately 4.1 micron thick layer of the photoconductive composition was formed over the screen by dip coating and the member was baked at a temperature of about 110° C. for about 20 hours. An elastomeric composition was formed comprising about 2 parts by weight of Sylgard 182 resin, about 0.2 part by weight of Sylgard 182 resin curing agent and about 2.2 part by weight of Dow Corning 200 dimethyl-polysiloxane silicone oil. The elastomeric composition was dissolved in isooctane at a ratio of about 3:2 by weight and an approximately 6.7 micron thick layer of the elastomer was formed on the photoconductive layer by dip coating. The member was then baked at about 110° C. for about 20 hours to cure the elastomer. The imaging member was then completed with the formation of a ½" diameter titanium-silver layer and a ½" diameter gold-indium-chromium layer on the surface of the elastomer layer by vacuum evaporating the metals thereon in a vacuum evaporation chamber under a vacuum of about $10^{-6}$ torr (the titanium was deposited at a rate greater than 1 Hz/sec and the silver, gold and indium at a rate greater than 10 Hz/sec). The titanium-silver layer was made according to the following schedule: 50 Hz Ti; 1 KHz Ag; 1.7 KHz Ag; this sequence was repeated three additional times. The gold-indium-chromium layer was made according to the following schedule: 1.5 KHz Au; 0.5 KHz In; 3KHz Au; 1 KHz In; 150 Hz Cr; 3 KHz Au; 1 KHz In; 150 Hz Cr; 1.5 KHz Au; 0.5 KHz In; 1.5 KHz Au; 0.5 KHz In.

Contacting leads were attached to the electrodes of the imaging members and to a Kepco D.C. Power Supply adjusted for an output of about 400 volts the NESA being the negative terminal. The imaging members were then operated in a cyclic mode or operation with each cycle taking about five seconds. Each imaging cycle comprised the following steps: voltage was applied to the imaging member in the dark; after about 1 second, the imaging member was exposed to uniform radiation generated by a 6 volt battery light projected through a diffuse screen (the readout light was not on during this time); after about 1 second and with the input light still on, the imaging member was exposed to uniform readout illumination from a 6 volt battery light; the readout illumination was collected by means of a schlieren read out system and projected on a screen; after about 3 seconds from the start of the cycle, the imaging member was shorted by connecting the leads together while the input and readout illumination were still being directed upon the member; after about 5 seconds from the start of the cycle, the input and readout lights were turned off and the sequence repeated.

Periodically, the cyclic mode of operation was interrupted to make measurements of contrast ratio and diffraction efficiency. It should be noted that measurements were made with the NESA connected to the negative and positive terminals; however, all of the imaging cycles were carried out with the NESA connected to the negative terminal. The curves shown in FIG. 2 represent the measurements where the NESA was connected to the positive terminal and FIG. 3 those where the NESA was connected to the negative terminal. The measurements were made with light of 6328 Å from He-Ne lasers. A Spectra Physics-Stabilite TM Model 120 was used for readin and a Spectra Physics Model 132 for readout. The sequence of steps used in making the measurements was similar to that described above with the exception that the readout illumination was directed upon the imaging member throughout the entire sequence. The input radiation was adjusted to achieve maximum diffraction efficiency by shuttering. The diffraction efficiency was measured by stopping out the zero order diffracted beam and focusing all of the other diffracted orders onto a Solar Cell Detector. The zero voltage level was measured by the same sequence of steps except that no voltage was applied to the imaging member and no input illumination was directed upon the member. It should be noted that the measurements illustrated in the Figures showing contrast ratio and diffraction efficiency represent peak values for the given testing conditions.

Figure 3:
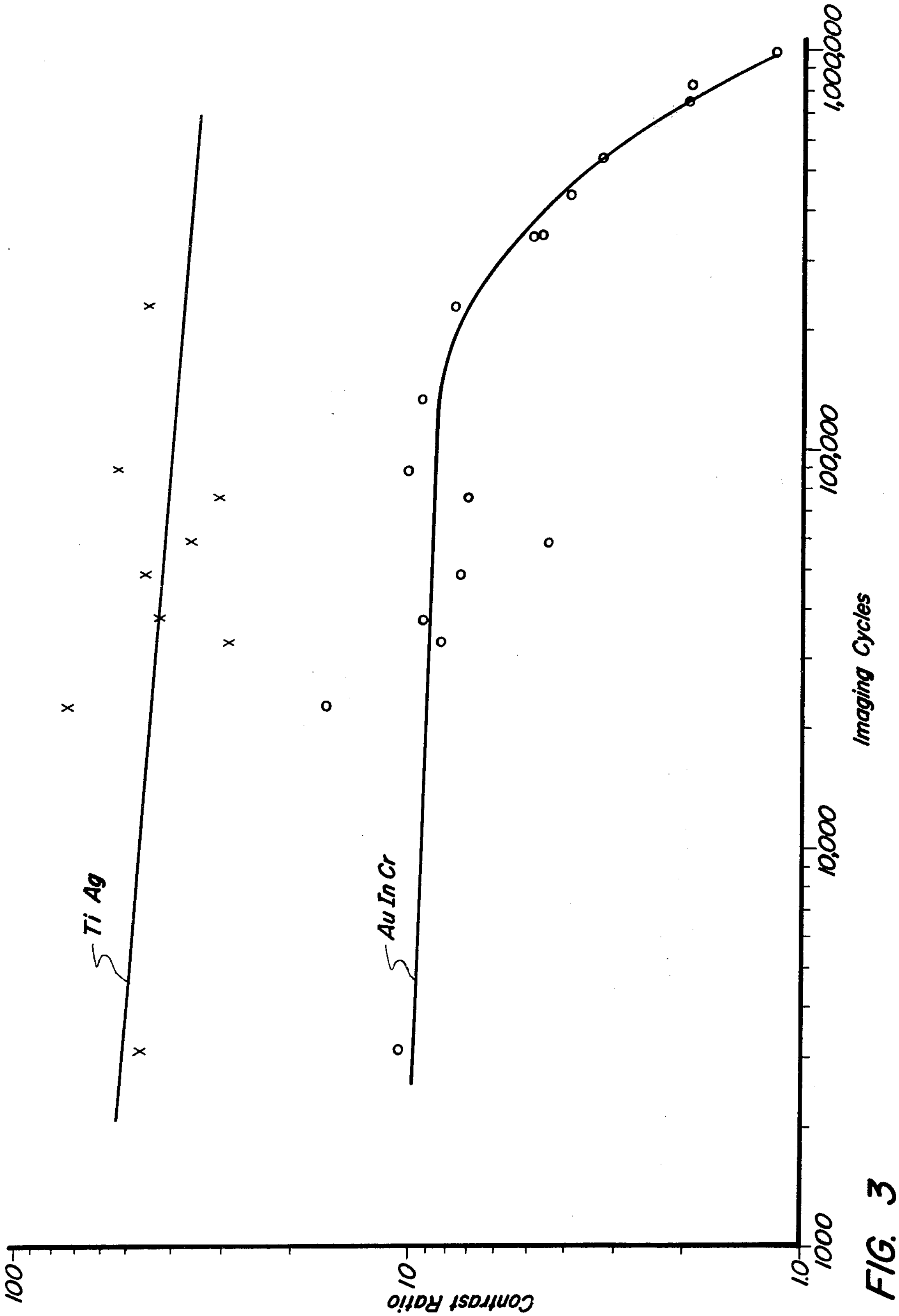
FIG. 3 is a logarithmic graphical illustration showing contrast ratio vs. number of imaging cycles for the same members used to obtain the results shown in FIG. 2 but with a different polarity of field applied during imaging.

The results illustrated in FIG. 2 show a surprising and unexpected significantly improved characteristic of the titanium-silver metallic layer. It can be seen that the contrast ratio for the imaging member with the titanium-silver layer is initially significantly higher than that for the member with the gold-indium-chromium layer. Additionally, it is seen that the contrast ratio for the titanium-silver member decreases only slightly over a range of more than 1,000,000 imaging cycles. It is also seen that the contrast ratio of the gold-indium-chromium member initially decreases at a low rate until about 200,000 imaging cycles after which it drops off sharply. This is evidence that the gold-indium-chromium metallic layer is subject to "cold working", that is, a permanent deformation tends to build up in the layer during usage which necessitates a significantly large change in readout optics to maintain image contrast. The titanium-silver imaging member shows only a very slight decrease in contrast ratio over a range of more than 1,000,000 cycles thus evidencing that this metal layer system does not exhibit any significant cold working. Of course, it will be appreciated that the gold-chromium-chromium imaging member is highly satisfactory device as is evidenced by the fact that is provides excellent results for about 200,000 imaging cycles. Nevertheless, the comparative results show the significantly superior contrast ratio for the titanium-silver imaging member. FIG. 3 illustrates the contrast ratio vs. number of imaging cycle curves for the same two imaging members used to provide the results shown in FIG. 2 with the exception that the NESA glass electrode is the negative electrode for these tests. Similar results were obtained thus indicating that the contrast ratio properties of these imaging members are substantially independent of the polarity of the electric field.

Figure 4:
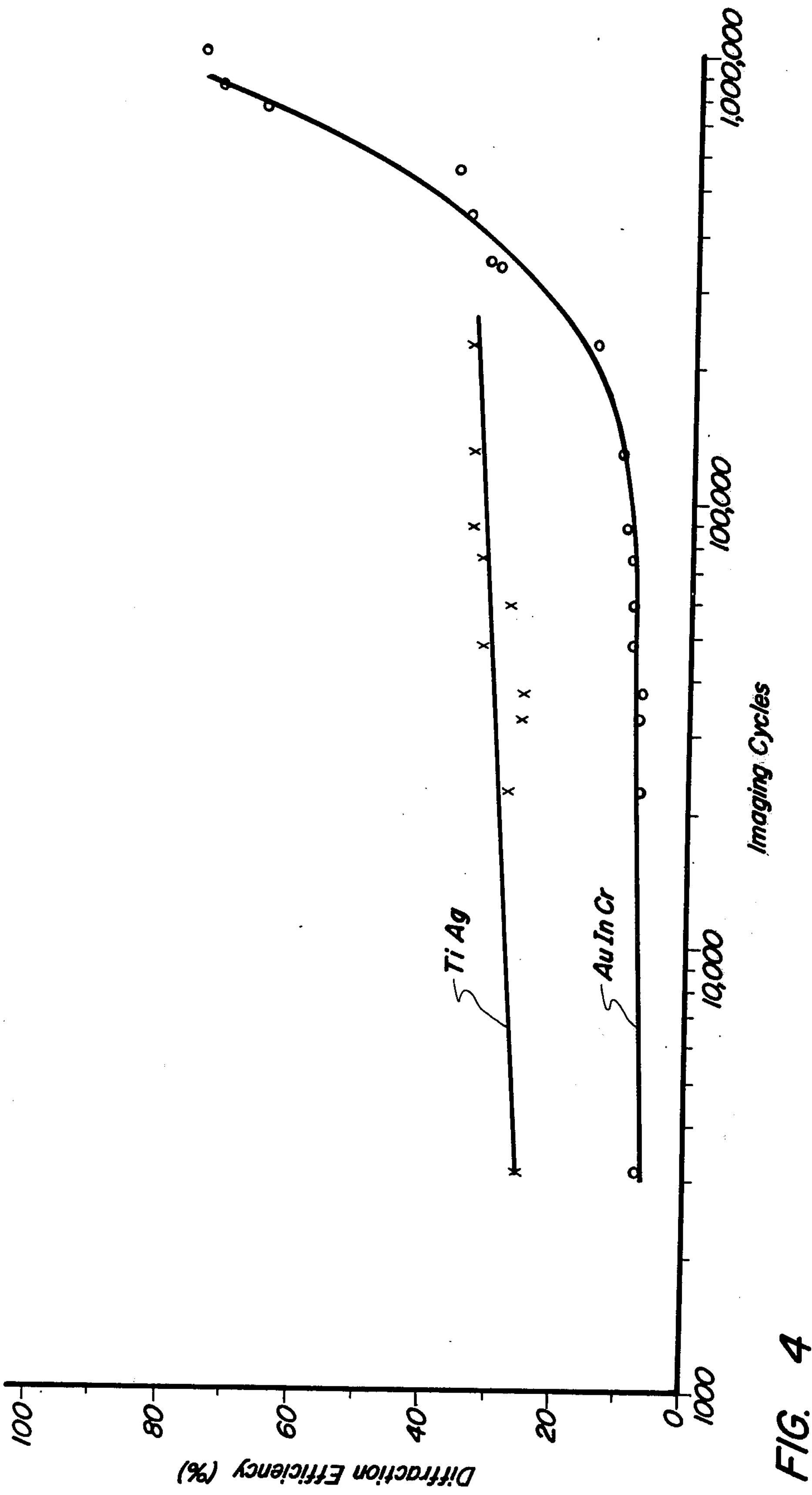
FIG. 4 is a semi-logarithmic graphical illustration showing diffraction efficiency vs. number of imaging cycles for the same members used to obtain the results illustrated in FIG. 2.
Figure 5:
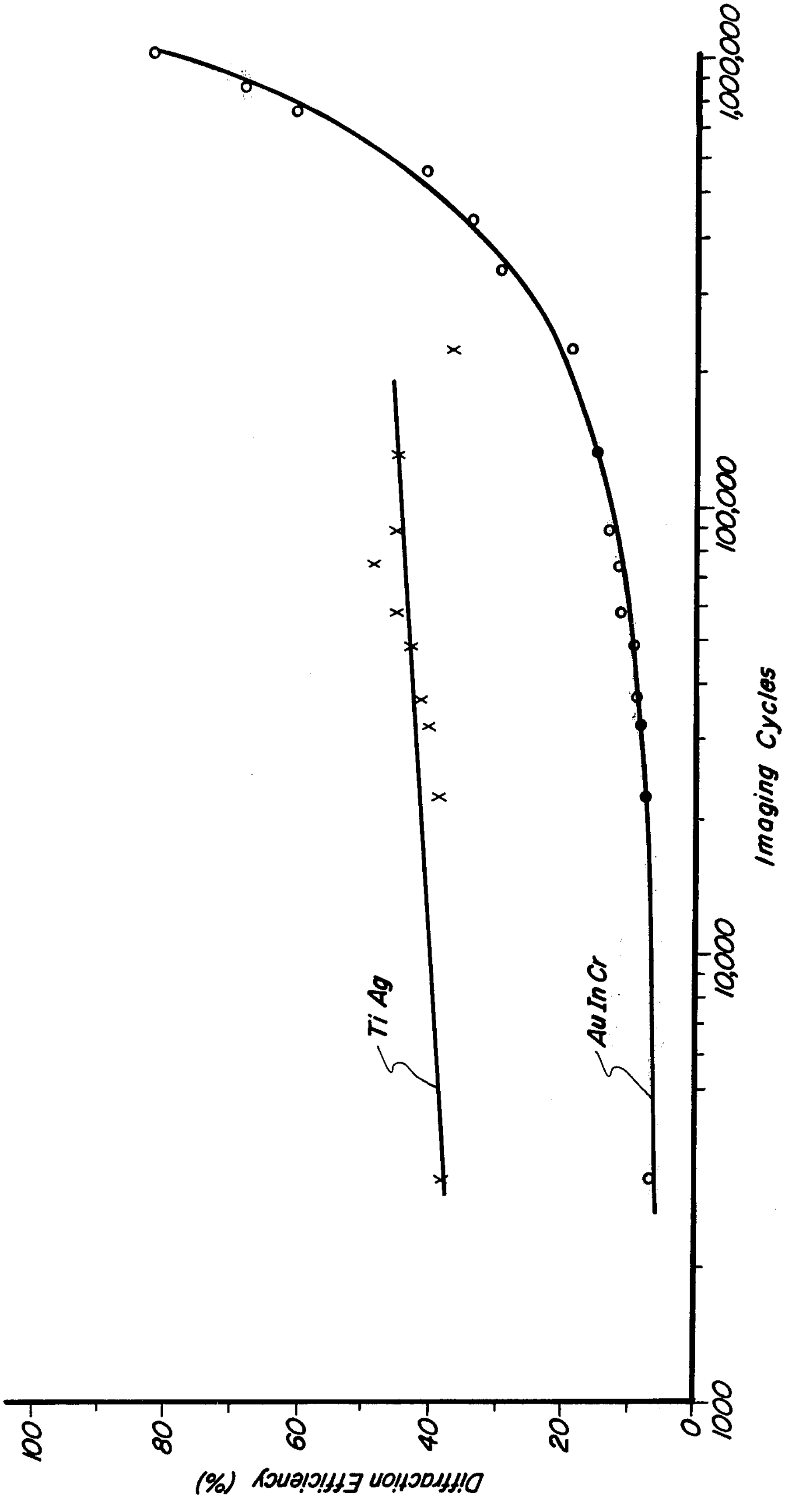
FIG. 5 is a semi-logarithmic graphical illustration showing diffraction efficiency vs. number of imaging cycles for the same imaging members and conditions used to obtain the results illustrated in FIG. 3.

FIG. 4 is a semi-logarithmic graphical illustration of the diffraction efficiency vs. number of imaging cycles for the same imaging members and operating conditions used to obtain the results shown in FIG. 2. It can be seen that, initially, the diffraction efficiency for the gold-indium-chromium imaging member is less than that for the titanium-silver imaging member but that after about 500,000 imaging cycles, the values for each are about the same and, subsequently, the diffraction efficiency for the former is higher than that for the latter. Of course, it is readily apparent that the diffraction efficiency of the titanium-silver imaging member is, in fact, highly satisfactory and increases slightly as the number of imaging cycles increases. FIG. 5 illustrates the diffraction efficiency vs. number of imaging cycles for the same imaging members and operating conditions used to obtain the results shown in FIG. 3. Similar results were obtained thus indicating that the diffraction efficiency properties of these imaging members are substantially independent of the polarity of the electric field.

It should be noted that similar results to those illustrated in FIGS. 2–5 have been obtained by conducting tests on imaging members which were not imaged but merely allowed to stand for a number of days, for example, up to about 50 days.

It should be recognized that the contrast ratio which an imaging member is capable of providing is an extremely important and critical characteristic of an imaging member. The contrast ratio is a comparison of the appearance of image and background areas and indicates the visual distinctness of image areas over background areas. Where the contrast ratio is unity, then no image can be perceived since the image and background areas would be equally bright. A contrast ratio of 5 or more is typically required for acceptable imaging. See, for example, "Fundamentals of Display System Design", S. Sherr, Wiley-Interscience, Wiley and Sons, Inc. Diffraction efficency is a measure of how effective the imaging member is in creating image areas, that is, how effectively the readout illumination is utilized by the member. However, a member may exhibit a high diffraction efficiency yet not provide very good images. For example, if a permanent deformation is built up in the imaging material over a number of imaging cycles with the attendant result that the background, or zero voltage, efficiency becomes significantly high, then it will be recognized that even very high diffraction efficiencies may not be able to overcome the contrast ratio deficiency. In other words, if the efficiency in the background areas begins to approach the maximum efficiency possible in the image areas, then a sharp observable image may not be provided by the imaging member. Therefore, it will be appreciated that the significantly superior contrast ratio characteristics exhibited by the novel imaging members of the present invention represent an important advance in the art.

It has been found that the effective life of the titanium-silver metallic layers is independent of the particular photoconductor used. However, the shelf life of these imaging members may be reduced when selenium or a selenium alloy is used as the photoconductor. It has been observed that the metallic layer in this instance has a tendency to become progressively more tarnished apparently due to chemical reaction of the selenium with the silver. In this instance barrier layers such as, for example, gold-indium undercoatings may be used to isolate the silver from the selenium and greatly increase the useful life of the chromium-silver metallic layer.

Overlying flexible conductive layer 20, there may be provided an optional transparent layer 26 of an insulating liquid, for example, oil. There are a number of advantages provided by the use of layer 26. The insulating liquid layer serves an important function when it has an index of refraction different than that of air. The presence of layer 26 over the flexible conductive layer 20 means light propagating from above the member will be modulated more than it would be if only air were present. The reason for this is that for the same magnitude of surface deformation, the optical path changes are proportional to the refraction index of the medium adjacent to the surface. As a consequence, if it were desired to maintain the same modulation as is provided by a device without layer 26, it would be possible to do so at lower voltages thereby ameliorating the possibility of voltage breakdown. A second advantage is that layer 26 serves as protection for conductive layer 20 by isolating it from contamination by dust or the like, maintaining a more constant ambient environment, etc. Additionally, layer 26 makes less stringent the fabrication requirements for the imaging member. The presence of pin holes in the elastomer layer 18 may cause the imaging member to short circuit, possibly destroying its performance. The addition of layer 26 may prevent such short circuits from disrupting the performance of the member by allowing insulating liquid to flow into such pin holes.

Potential source 22 provides D.C. voltage of one polarity to form a deformation image on the surface of the elastomer. The polarity required depends upon the nature of the photoconductor. The voltage drop across the photoconductor-elastomer sandwich will be in the range of from about 1 to about 25,000 volts depending upon the modulus of elasticity of the elastomer and its thickness as well as certain properties of the photoconductor. Potential source 22 must be capable of being turned off to erase the image, or, undergo a shift in polarity to erase the image more rapidly. For a television type of picture wherein approximately 30 complete images per second are formed, stored and erased, the power supply must be capable of undergoing such cycles with appropriate speed. The extent of the deformation and the rapidity with which information may be erased is dependent upon the voltages supplied by the power source. The stability of the voltage output of the power source must be great enough to prevent unwanted erasure of the image. An alternate scheme for erasing the surface deformation image is to position a strobe light below imaging member 10 to flood the photoconductive layer 16 with light thereby erasing the modulated field pattern across the structure set up by the image-wise light. This operation is appropriate as long as the fields across the elastomer layer 18 are below a level causing the surface deformations to be locked. To form and lock the deformation image, the values of voltage between conductive layer 14 and flexible conductive layer 20 would be approximately between 1 and 25,000 volts depending upon the thickness and other characteristics of elastomer 18.

The images formed in the imaging member will typically erase because of any of a number of reasons. For example, charge carriers generated in the photoconductor may reach the photoconductor-elastomer interface; or charge carriers present at the photoconductor-elastomer interface may flow laterally; or charge carriers may be injected into the elastomer layer from the photoconductor-elastomer interface and reach the metallic layer. All of these effects cause the contrast potential across the elastomer to diminish or disappear.

The images may be erased more quickly by removing the field from across the elastomer layer or by reversing the polarity of the field. For even more rapid erasure, the photoconductor may be flooded with activating electromagnetic radiation at the same time that the field is removed or the polarity thereof reversed.

It should be noted that other elements besides those described herein and illustrated in FIG. 1 may be incorporated in the advantageous imaging members of the invention. As previously noted, according to a preferred embodiment of the invention, images having spatial frequencies substantially lower than the resonant deformation frequency of the elastomer can be recorded by placing an absorption type line grating between the projected light image and the photoconductor upon which it is imaged. The elastomer will deform along the pattern of the high spatial frequency screen in those areas where it is illuminated. The screened deformation image will then be made up of segments of the shadow of the screen. The image obtained by illuminating the deformed elastomer layer will thus have a fine structure of lines superimposed upon the original image that was recorded. If this line structure is objectionable, it may be removed by suitable optical filtering techniques well-known in the art. For the imaging members of the invention, the preferred location of the screen, e.g., a line grating, is immediately adjacent to the photoconductive layer in the member. Other types of screens that may be similarly located are described in U.S. Pat. Nos. 3,698,893 and 3,719,483.

A number of variations of the various elements may be substituted for those used in the imaging member set forth above and illustrated in FIG. 1. Hence, any one of any combination of the elements hereinafter described may be substituted for a corresponding element described above herein.

As stated previously, adjacent photoconductive and elastomer layers may be replaced by a single layer of a photoconductive elastomer. For example, the elastomer made by combining Sylgard 184 with dimethylpolysiloxane oils may be made photoconductive for blue or ultraviolet light by adding p-phenylendiamine, indoform and Calco oil orange dye (available from American Cyanamid Co.) prior to the curing thereof.

Figure 6:
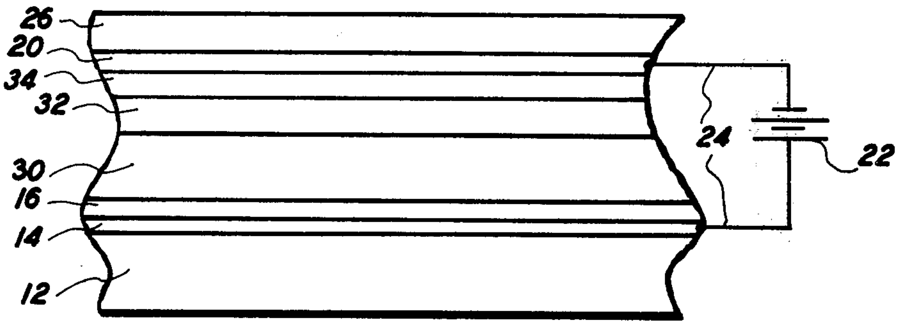
FIG. 6 is a partially schematic cross-sectional view of an embodiment of an electro-optic imaging member according to the invention.

With respect to the elastomer layers, a thin elastomer layer is capable of undergoing appreciable elastic deformation for only a finite bandwidth of spatial frequencies. Its response outside this bandwidth is less than optimum. The spatial frequency response of the elastomer may be broadened or made multiply peaked by replacing the single elastomer layer with a multiply layered apparatus as illustrated in FIG. 6. Each of these layers 30, 32 and 34 will have a different limited spatial frequency response, but the combination of layers will have a broad or multiply peaked spatial frequency response. In general it will be noted that the thickest layer 30 will be placed closest to the photoconductor and the thinnest layer 34 will have the deformable surface. Two or more or such layers may be used as desired. As described previously, each of these layers may also be photoconductive, eliminating the need for a separate photoconductor and, in some instances, enhancing the resolution of the device.

It should also be noted that, in addition to controlling the thickness of the elastomer layer to peak its spatial frequency response for a given spatial frequency bandwidth, its elastic modulus will also be controlled to obtain deformations commensurate with that spatial frequency bandwidth. Materials of lower elastic modulus are capable of greater elastic deformations. On the other hand, materials of higher elastic modulus may be more quickly erased. Such factors must be taken into account when designing the apparatus for speed or greater deformation.

It has hereinabove been set forth that the elastomer surfaces as described herein may be used for the recording, storage and erasure of image information over a great many cycles, provided that the electric fields across the elastomer are not allowed to become excessively great. When these fields do become great enough that the deformations of the elastomer surface exceed the elastic limit of the elastomer, it has been observed that the image is permanently recorded on the elastomer. The upper limit on the electric field applied to the previously mentioned dimethylpolysiloxane silicone gel is observed to be about 100 volts per micron. While for many systems this is regarded as undesirable, there are those in which it is also desired to record a permanent image. Thus, the cyclic properties of the elastomer may be used in an attempt to obtain a satisfactory image which is then permanently recorded by an over voltage application.

It will be appreciated by those skilled in the art that the imaging members of the invention may be used in numerous applications such as, for example, for image storage, as optical buffers, image intensification, etc. For a detailed description of some specific applications for these imaging members, see U.S. Pat. No. 3,716,359.

The advantageous titanium-silver flexible metallic layer compositions of the present invention will be further described with respect to specific preferred embodiments by way of Examples, it being understood that these are intended to be illustrative only and the invention is not limited to the materials, conditions or procedures recited therein. All parts and percentages are by weight unless otherwise specified.

EXAMPLES

In all the following Examples, the titanium is evaporated from a coiled tungsten basket and the silver from a molybdenum boat. The vacuum evaporation is carried out in a vacuum chamber at a vacuum of about $10^{-6}$ torr and at rates of greater than 10 Hz/sec for the silver and greater than 1 Hz/ sec for titanium.

EXAMPLE I

45 Hz Ti are deposited upon a member comprising an approximately 12 micron thick elastomer layer residing on a NESA glass substrate followed by 1 KHz Ag, 2 KHz Ag, 75 Hz Ti, 1 KHz Ag and 2 KHz Ag.

EXAMPLE II

60 Hz Ti are deposited upon a member comprising a NESA glass substrate carrying a line screen, an approximately 5 micron thick photoconductive layer and an approximately 5 micron thick elastomer layer followed by 1.4 KHz Ag and 1.8 KHz Ag. This sequence is repeated two additional times.

EXAMPLE III

60 Hz Ti are deposited upon a member comprising a NESA glass substrate, an approximately 3 micron thick photoconductive layer and an approximately 6 micron thick elastomer layer followed by 1 KHz Ag. This sequence is repeated three additional times followed by 100 Hz Ti, 1.3 KHz Ag and 1 KHz Ag.

EXAMPLE IV

20 Hz Ti are deposited upon a member comprising a NESA glass substrate carrying a line screen, an approximately 6.5 micron thick photoconductive layer and an approximately 6 micron thick elastomer layer followed by 600 Hz Ag and 2.3 KHz Ag. A second sequence of layers made up of 50 Hz Ti, 600 Hz Ag and 1.3 KHz Ag is deposited. This second sequence is repeated two additional times.

EXAMPLE V

50 Hz Ti are deposited upon a member comprising a NESA glass substrate carrying a line screen, an approximately 4.1 micron thick photoconductive layer and an approximately 6.7 micron thick elastomer layer followed by 1 KHz Ag and 1.7 KHz Ag. This sequence is repeated three additional times.

It will be understood that various other changes in the details, materials, steps and arrangement of elements which have been described herein and illustrated in order to explain the nature of the invention will occur to and may be made by those skilled in the art upon a reading of this disclosure and such modifications are intended to be included within the principle of the invention and the scope of the claims.

What is claimed is:

1. An imaging member comprising a layer of photoconductive material, an electric field deformable elastomer layer having a volume resistivity above about $10^4$ ohm-cm overlying said photoconductive material layer and flexible conductive metallic layer comprising titanium and silver overlying said elastomer layer, said elastomer layer being capable of deforming to correspond to an electrical field pattern created by altering an electrical field across said elastomer layer by exposing the photoconductive material to electromagnetic radiation to which it is sensitive.

2. The member as defined in claim 1 wherein said member includes a plurality of said electric field deformable elastomer layers, each said elastomer layer having different thickness and elastic modulus from said other elastomer layers.

3. The imaging member as defined in claim 1 and further including a layer of insulating liquid overlying said flexible conductive metallic layer.

4. The imaging member as defined in claim 1 and further including means for spatially modulating an electric field across said elastomer layer at a frequency within the spatial frequency deformation capability of the elastomer layer.

5. The imaging member as defined in claim 4 wherein said means for spatially modulating includes a line grating adjacent said photoconductive material layer.

6. The member as defined in claim 1 and further including a substrate for supporting the layers of said imaging member.

7. The member as defined in claim 6 wherein said substrate is a transparent conductive member.

8. An imaging method comprising (a) providing an imaging member according to claim 7;

(b) subjecting said imaging member to an electric field; and (c) exposing said imaging member to information modulated electromagnetic radiation to which the photoconductive material is responsive to deform the elastomer layer corresponding to changes in the electric field caused by the exposure.

9. The method as defined in claim 8 wherein said electric field to which said imaging member is subjected is spatially modulated at a frequency within the spatial frequency deformation capability of the elastomer layer.

10. The method as defined in claim 8 wherein said electric field is of a strength sufficient to permanently deform the elastomer layer.

11. The method as defined in claim 8 and further including illuminating said imaging member with readout electromagnetic radiation to optically construct an image corresponding to the deformations in the elastomer layer.

12. The method as defined in claim 11 and further including the step of erasing the deformations in the elastomer layer.

13. The method as defined in claim 12 wherein said step of erasing includes removing the electric field to which the imaging member is subjected.

14. The method as defined in claim 12 wherein said step of erasing includes reversing the polarity of the electric field to which the imaging member is subjected.

15. An imaging member comprising an electric field deformable elastomer layer having a volume resistivity above about $10^4$ ohm-cm, said elastomer layer including photoconductive material, and a flexible conductive metallic layer comprising titanium and silver overlying said elastomer layer, said elastomer layer being capable of deforming to correspond to an electrical field pattern created by altering an electrical field across said elastomer layer by exposing the photoconductive material to electromagnetic radiation to which it is responsive.

16. The member as defined in claim 15 wherein said member includes a plurality of said electric field deformable elastomer layers, each said elastomer layer having a different thickness and elastic modulus from said other elastomer layer.

17. The member as defined in claim 15 and further including a layer of insulating liquid overlying said flexible conductive metallic layer.

18. The member as defined in claim 15 and further including means for spatially modulating an electrical field across said elastomer layer at a frequency within the spatial frequency deformation capability of the elastomer layer.

19. The member as defined in claim 18 wherein said means for spatially modulating includes a line grating adjacent said elastomer layer.

20. The member as defined in claim 15 and further including a substrate for supporting the layers of said imaging member.

21. The member as defined in claim 20 wherein said substrate is a transparent conductive member.

22. An imaging method comprising (a) providing an imaging member according to claim 21;

(b) subjecting said imaging member to an electric field; and (c) exposing said imaging member to information modulated electromagnetic radiation to which the photoconductive material is responsive to deform the elastomer layer corresponding to changes in the electric field caused by the exposure.

23. The method as defined in claim 22 wherein said electric field to which said imaging member is subjected is spatially modulated at a frequency within the spatial frequency deformation capability of the elastomer layer.

24. The method as defined in claim 22 wherein said electric field is of a strength sufficient to permanently deform the elastomer layer.

25. The method as defined in claim 22 and further including the step of erasing the deformations in the elastomer layer.

26. The method as defined in claim 25 wherein said step of erasing includes removing the electric field to which the imaging member is subjected.

27. The method as defined in claim 25 wherein said step of erasing includes reversing the polarity of the electric field to which the imaging member is subjected.

28. The method as defined in claim 22 and further including illuminating said imaging member with read-out electromagnetic radiation to optically construct an image corresponding to the deformations in the elastomer layer.

* * * * *